United States Patent
Kodama

[11] Patent Number: 6,031,240
[45] Date of Patent: Feb. 29, 2000

[54] METHOD AND APPARATUS FOR ION IMPLANTATION

[75] Inventor: Shuichi Kodama, Tokyo, Japan

[73] Assignee: NEC Corporation, Tokyo, Japan

[21] Appl. No.: 09/053,675

[22] Filed: Apr. 2, 1998

[30] Foreign Application Priority Data

Apr. 7, 1997 [JP] Japan ................................. 9-088434

[51] Int. Cl.[7] ............................. G21K 5/10; H01J 37/317
[52] U.S. Cl. ................................. 250/492.21; 250/492.2; 250/492.3
[58] Field of Search ........................... 250/492.21, 492.2, 250/492.3

[56] References Cited

U.S. PATENT DOCUMENTS 5,451,784 9/1995 Loewenhardt et al. ................. 250/305
5,760,409 6/1998 Chen et al. .......................... 250/492.21

*Primary Examiner*—Edward P. Westin
*Assistant Examiner*—Nikita Wells
*Attorney, Agent, or Firm*—McGinn & Gibb, P.C.

[57] ABSTRACT

A method of ion implantation is provided by utilizing an ion implantation apparatus comprising a disc having a slit, an ion source, and a scanning mechanism for scanning the ion beam by moving the disc two-dimensionally which includes a motor, a stepping motor etc. The quantity of ions in the ion beam is first measured at a plurality of positions along the longitudinal direction of the slit and a plurality of data sets representing the position in the slit and the quantity of ions in the ion beam is provided. The quantity of ions in the ion beam for the ion implantation is adjusted according to the data sets in order to obtain the uniform dose of ions introduced in the wafer surface.

6 Claims, 8 Drawing Sheets

SCANNING DIRECTION

SCANNING DIRECTION

METHOD AND APPARATUS FOR ION IMPLANTATION

BACKGROUND OF THE INVENTION

1. Field of the Invention

The present invention relates to a method for ion implantation used as one of methods for introducing an impurity in, for example, the field of the fabrication of semiconductor devices and to an apparatus for executing the method thereof.

This application is based on patent application No. Hei 9-088434 filed in Japan, the content of which is incorporated herein by reference.

2. Background Art

Ion implantation is used as one of the methods for introducing an impurity in the field of the fabrication of semiconductor devices. Ion implantation technology is widely used due to the major advantage that the dose of impurity atoms introduced into a target can be controlled very precisely by monitoring the integrated value of the injecting ionic current. The other advantages of ion implantation techniques is that the introduction of impurity atoms can be implemented without being hindered by a thin oxide layer formed on the target surface, and that doping can be carried out over a considerably wide target area under a controlled concentration and a controlled injection depth profile.

An example of ion implantation apparatuses is disclosed in Japanese Patent Application, First Publication, No. Hei 2-18851.

FIGS. 6 and 7 illustrate the conventional apparatus for ion implantation disclosed in the above Patent Application. Reference numeral 1 represents a semiconductor wafer, reference numeral 2 represents a disc for supporting a plurality of wafers 1 and for rotating the wafers in the X direction, numeral 3 represents a slit formed passing right through the thickness of the disc 2 at an predetermined position, numeral 4 represents an rotating shaft of the disc 2, numeral 5 represents a disc-holder for supporting the rotating shaft 4 of the disc 2, and numeral 6 represents a motor for rotating the rotating shaft 4 at a predetermined speed. Furthermore, reference numeral 7 represents a lead screw connected to the disc holder 5 and numeral 8 represents a stepping motor for rotating the lead screw 7. The stepping motor 8 may rotate the lead screw 7 in both rotating directions by means of a driver 9. The disc-holder 5 moves in either directions Y1 and Y2 according to the reciprocating rotation of the stepping motor 8.

Ionic particles are introduced into the wafer 1 by scanning the ion beam on the surface of the wafer when the wafer 1 enters under the path of an ion beam B. The scanning of the ion beam is performed by combining a movement of the disc 2 in the X direction and a reciprocal movement of the disc holder 5 in directions Y1 and Y2. Furthermore, when the slit 3 enters in the path of ion beam B by the rotation of the disc 2, ion beam B passes through the slit to be admitted in an ion beam detector 10 disposed behind the disc 2. The details of the ion beam detector will be described hereinafter.

In a controller 11, a timing generator 15 generates a timing signal 15a when the generator 15 detects that the ion beam enters at a position to be admitted in the ion beam detector 10 as shown by an broken line arrow in FIG. 6, and the timing signal 15a is then transmitted to a CPU 16. Reference numeral 12 represents a sample holding amplifier for sampling an ion beam current according to a command signal 16a generated by the CPU 16 based on the timing signal 15, and for supplying the sampled value of the ion beam current 12a to a V/F converter 13 while holding the sampled current 12a until the next sampling time. The V/F converter 13 converts the sampled value 12a into a frequency signal 13a.

A beam counter 17 then counts the frequency signal 13a and generates the counter signal 17a, which is then transmitted to CPU 16. Consequently, the CPU 16 obtains the number of ionic particles introduced in the wafer 1 as a dose. On the other hand, the frequency signal 13a is divided by a frequency divider 14 according to the control signal 16b of CPU 16, and the divided signals 14a is transmitted to the driver 9. The driver 9, then drives the stepping motor 8 at a rate proportional to the signal 14a. The rotational speed of the lead screw 7 (the scanning speed of the disc 2) is controlled to be proportional to the signal 14a.

The CPU 16 receives the signal 14a of the divider 14 and can obtain a number of scanning cycles and an amount of displacement of the disc-holder 5, etc. In a manner as described above, the CPU 16 controls the scanning speed of the disc 2 by generating the command signal 16b through the predetermined calculation procedures based on the signals 14a and 17a. For example, if the detected quantity of the ion beam is too large, the CPU controls so as to decrease the scanning speed of the disc 2.

However, a few problems were observed in the above conventional ion implantation apparatus. The first problem was observed when the slit 3 is deformed by damage or deterioration caused by hitting of the ion beam, as shown in FIG. 8, which shows an example in which a width of the slit 3 is extended at the central portion by ion hitting. In this case, the ion dose distribution was non-uniform in a wafer surface area, even though the ion beam current I is maintained at a constant value.

That is, if the slit 3 is deformed, for example, as shown in FIG. 8, an ion beam current $I_2$ passing through the center part of the slit 3 is larger than ion beam currents $I_1$ and $I_3$ which pass through both end portions of the slit 3. As a result, the scanning speed for ion beam impinging on the position B' in the wafer 1 being set faster than that of the ion beam impinging on the positions A' or C'. However, since the quantity of ions in the ion beam B, that is, the current of the ion beam B is maintained constant, the dose at the central portion B' becomes small. That is, the first problem was that the deformation of the slit 3 produces non-uniform distribution of the dose in the wafer.

In the conventional ion implantation apparatus, as shown in FIG. 9, a second problem was observed in that the ion beam B projecting on the central portion of the wafer is apt to spread in a larger area than that of the ion beam projecting on the peripheral area of the wafer due to the effect of charge-up of the wafer surface. When the slit 3 is not deformed, the ion beam current $I_4$ at the central portion becomes smaller than the ion beam current $I_5$ at the peripheral areas. This results in setting the scanning speed at the central portion far lower than the necessary speed and produces a higher dose at the center portion of the wafer, because the ion beam current is maintained at a constant current.

That is, the second problem of the conventional apparatus is that it is not provided with a device to eliminate the effect of the charge-up of the wafer surface so that wafers with a non-uniform dose distribution are produced.

SUMMARY OF THE INVENTION

In view of the above problems, the present invention has the object of offering a method and apparatus for ion implantation which ensures a uniform dose distribution in the wafer surface by compensating influences caused by the slit deformation and by change of the beam shape due to charge-up of the wafer surface.

One aspect of the present invention is a method for ion implantation using an apparatus comprising: a substrate holder provided with a substrate support surface and a slit formed passing through the thickness of the substrate holding surface; an ion beam source to project the ion beam towards the substrate holder; a scanning mechanism for scanning at least one of the substrate holder and the ion beam; wherein the method comprising steps of: measuring the quantity of ions in the ion beam, that is, the ion beam current at a plurality of positions along the longitudinal direction of the slit, providing a set of data including dose rate at a plurality of positions, and controlling the quantity of ions in the ion beam projected on the silicon wafer for uniform dose distribution.

According to this aspect of the present invention, the quantity of ions in the ion beam is measured at many positions along the longitudinal direction of the slit. From these measurement, a plurality of data sets is provided which is consisting of the positional data in the longitudinal direction of the slit and the quantity data of ion beam at respective positions. The quantity of ions in the ion beams to be projected is controlled based on these data sets. Therefore, even if the slit is deformed along its longitudinal direction, the quantity of the ions in the ion beam passing through the slit is adjusted by the data sets and the dose of the ion is controlled so as to yield a uniform dose distribution in every location on the wafer surface.

Another aspect of the invention is a method for implantation, wherein the method further comprising the steps of: locating dummy wafer adjacent to the slit prior to the ion beam injection, providing a plurality of data sets by measuring the quantity of ions in the ion beam at respective positions along the longitudinal direction of the slit by alternately projecting ion beams to measuring points and respective points on the dummy wafer adjacent to the measurement points.

According to this aspect of the invention, the measurement of the quantity of ions in the ion beam is performed at many positions along the longitudinal directions of the slit, by alternately projecting ion beams toward respective measurement positions along the slit and projecting ion beams toward positions on the dummy wafer adjacent to the positions along the longitudinal direction of the slit. Therefore, the change of the quantity of ions in the ion beam passing through the slit due to the deformation of the ion beam by the charge-up of the wafer can be compensated, and the quantity of ions in the ion beam projecting at every location on the wafer surface are controlled so as to yield a uniform dose at every location on the wafer surface.

The other aspect of the present invention is an apparatus for ion implantation comprising: a substrate holder having a substrate support surface and a slit formed penetrating the thickness of the substrate support surface; an ion source to project the ion beam towards the wafer holder; a scanning mechanism for scanning the wafer surface by scanning at least one of the substrate holder and the ion beam in two-dimensional and parallel directions along the substrate holding surface; a position detecting means for detecting the location of the ion beam in the longitudinal direction of the slit;
a measuring means for measuring the quantity of ions in the ion beam passing through the slit;
a memory for storing a plurality of data sets obtained by the position detecting means and the measuring means; and a controlling means for controlling the quantity of ions in the ion beam according to the set of data.

According to this aspect of the present invention, the quantity of ions in the ion beam is measured at a plurality of positions along the longitudinal direction of the slit. From the measurement, a set of data is prepared consisting of the positions in the longitudinal direction of the slit and the quantity of ions in the ion beam at these positions. The quantity of ions in the ion beam is controlled according to these data to ensure the uniform dose distribution. Therefore, even if the slit is deformed and the width of the slit becomes not uniform along its longitudinal axis, the amount of the ion beam passing through the slit is adjusted according to the set of data and the quantity of ions in the ion beam is controlled so as to ensure uniform implantation at every location on the wafer surface.

According to another aspect of the invention, the measurement of the quantity of ions in the ion beam projecting at respective positions along the longitudinal direction of the slit is performed alternately for the ion beam irradiating toward the measurement position in the slit and for the ion beam toward the position adjacent to the measurement position in the slit. Therefore, the change of the quantity of ions in the ion beam current passing through the slit due to the deformation of the ion beam by the charge-up of the substrate can be compensated, and the quantity of ions in the ion beam injecting at every locations on the wafer surface is controlled to ensure uniform implantation.

According to this aspect of the invention, since the apparatus is provided with the position detecting means and the measuring means for measuring the quantity of ions in the ion beam passing through the slit, a plurality of data sets is provided consisting of the position data in the slit and the quantity data of ion beam at respective positions. These data sets are stored in the memory installed in the controller and these data sets make it possible to control the quantity of ions in the ion beam by the controller to ensure uniform implantation.

DESCRIPTION OF PREFERRED
EMBODIMENTS OF THE INVENTION

The first embodiment of the present invention will be described hereinafter referring to FIGS. 1 and 2.

Figure 1:
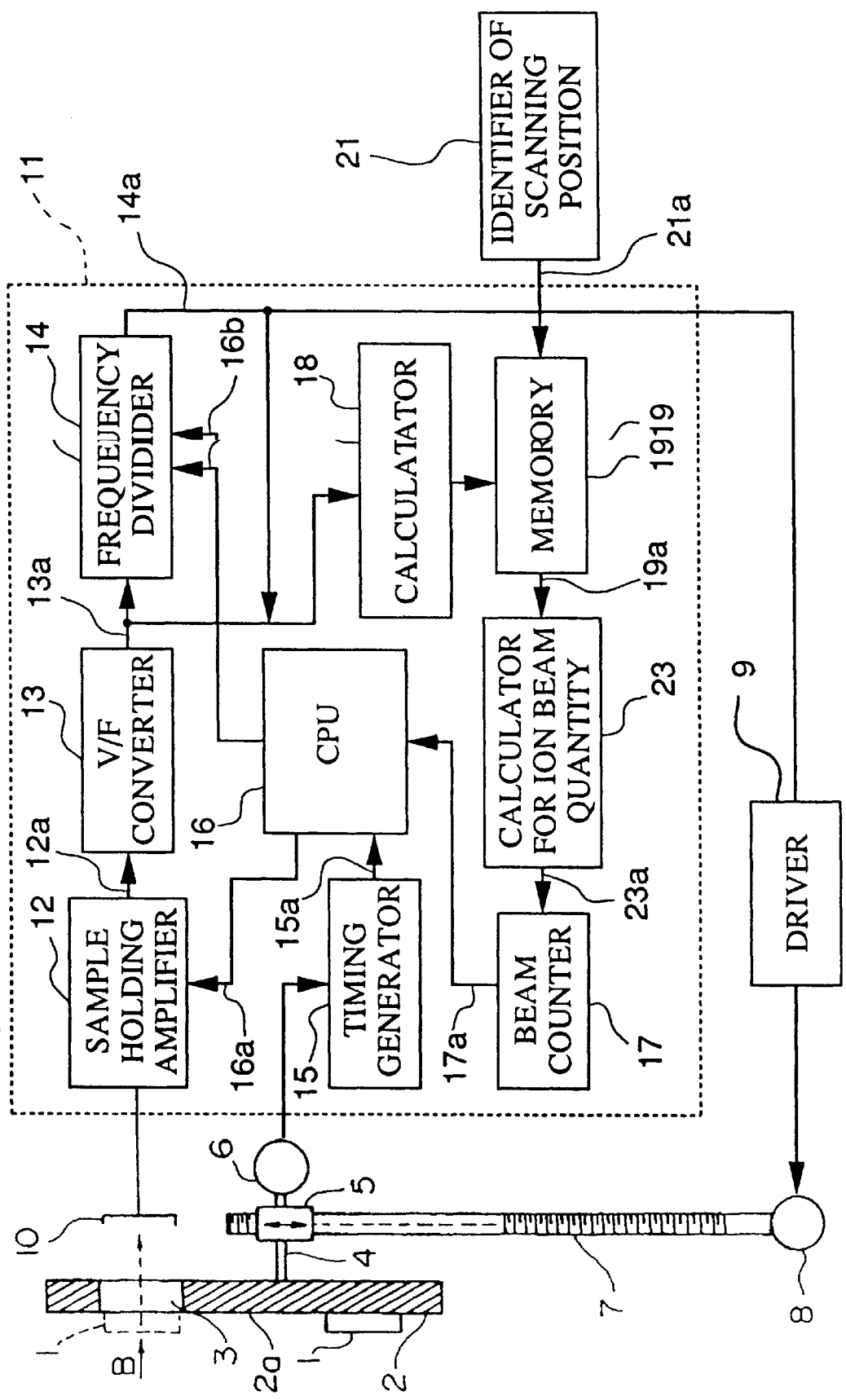
FIG. 1 shows a schematic block diagram of an control apparatus for ion implantation according to an embodiment of the present invention and a part of the apparatus is shown in cross sectional view.
Figure 2:
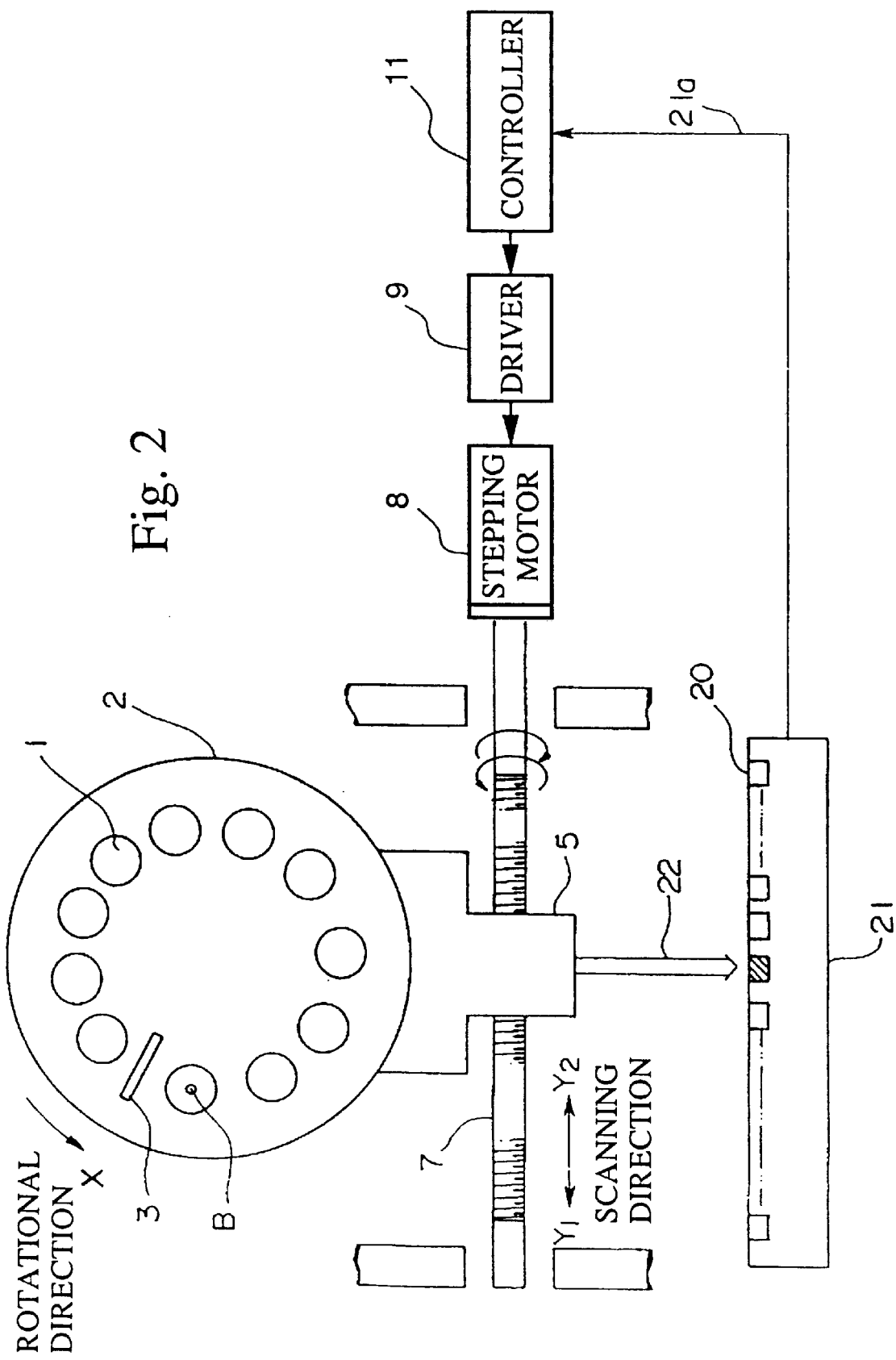
FIG. 2 shows a front view of the ion implantation apparatus shown in FIG. 1.

FIGS. 1 and 2 illustrate an apparatus for ion implantation according to the first embodiment of the present invention. In these figures, same reference numerals are used for the same parts as those in the conventional apparatus, and the explanations of those parts are omitted.

The disc or the wafer support base 2 is installed in the apparatus so as to be rotatable by a motor 6 in a direction X as well as in a direction X' (described hereinafter referring to FIG. 5). Furthermore, the disc 2 is moved in either directions of Y1 and Y2 by rotation of the lead screw 7 driven by reciprocal rotation of the stepping motor energized by the signal of the driver 9, based on the command signal of the controller 11. Thus, the disc 2 is two-dimensionally scanned parallel to the wafer surface.

As depicted in FIG. 2, the apparatus of the present embodiment comprises a position identification device 21 provided with a plurality of sensors 20. In this position identification device 21, the identification of the position of the ion beam is carried out by the structure in which one of a plurality of sensors 20 located at a corresponding position with the ion beam B on the disc 2 receiving light 22 generated by the disc support base 5. The position signal 21a obtained by the position identification device 21 is transmitted to the controller 11.

Furthermore, as illustrated in FIG. 1, there is provided in the controller 11 a calculating device 18 for calculating a dose calibration factor which is a normalized quantity of the ion beam, a memory 19 for storing a set of data comprising the position information obtained by the position identification device 21 and the dose calibration factor representing the quantity of ions in the ion beam obtained by the calculating device 21, and a computing device 23 for computing the appropriate current of the ion beam for ion beam implantation.

First Method

Hereinbelow, a first method of the ion implantation according to the present invention shall be described. In this method, prior to the ion implantation, calibration of the quantity ion beam along the longitudinal direction of the slit 3 is carried out as described below.

Figure 3:
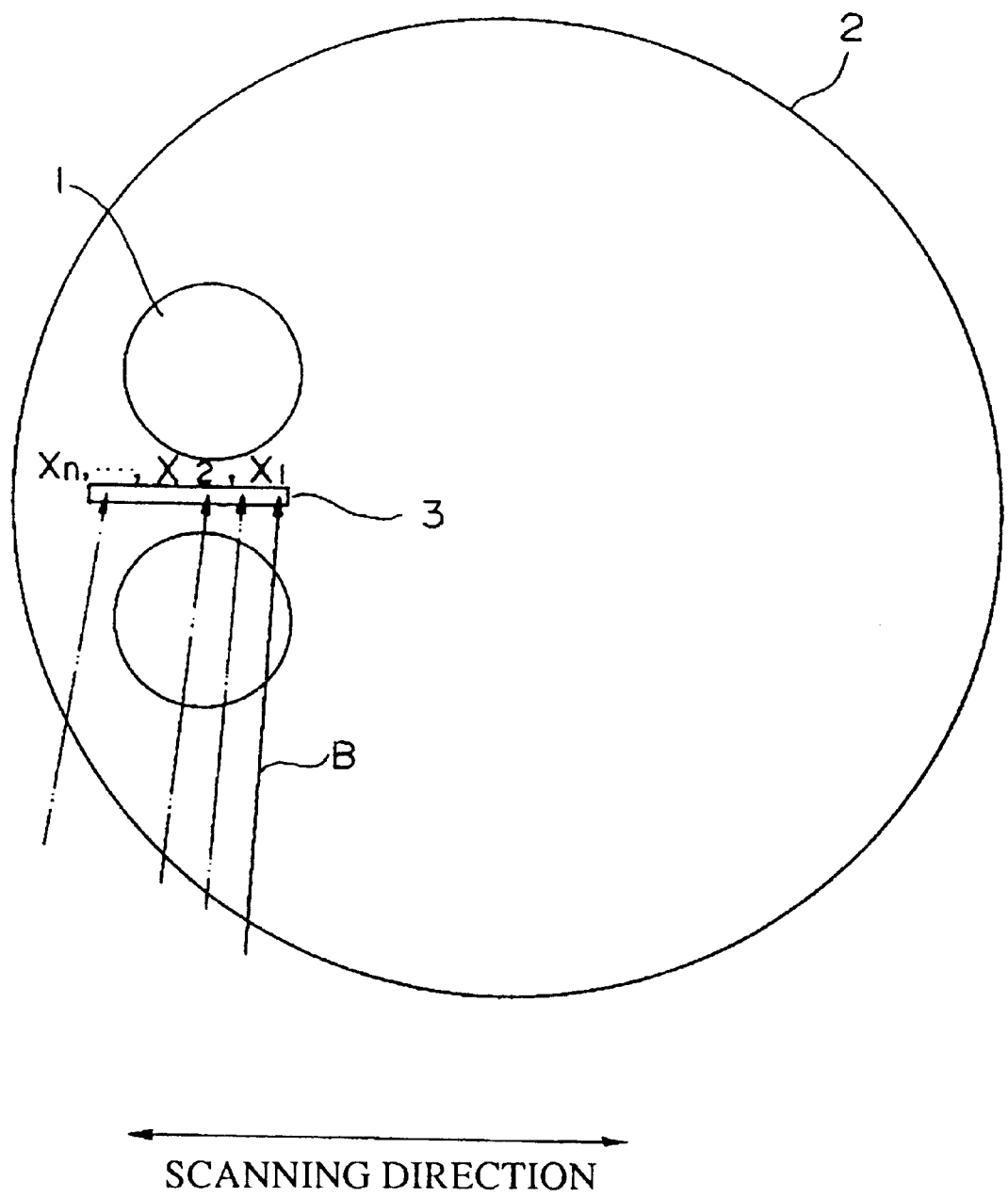
FIG. 3 is a diagram to explain a first method of ion implantation according to the present invention.
Figure 4:
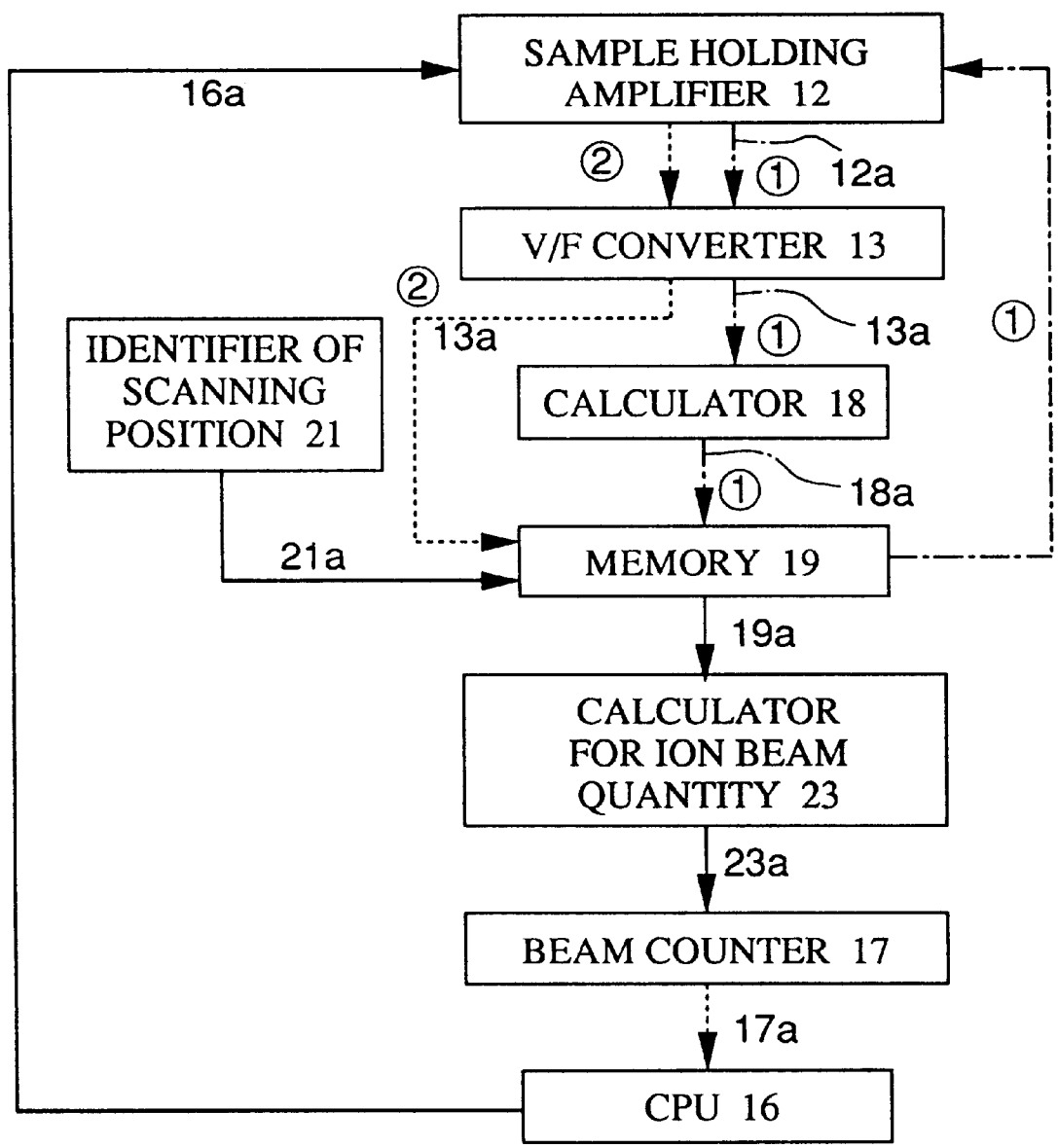
FIG. 4 is a flow chart to explain the first method of ion implantation by the present invention.

First, as shown in FIG. 3, the disc 2 is rotated such that ion beam B is injected into the position of X1 in the slit 3. In this case, the ion beam B passing through the slit 3 is converted into a signal 13a by the sample holding amplifier 12 and by the V/F converter 13 and the signal 13a is transmitted to the calculating device 18, as shown in FIG. 4. In the calculating device 18, the dose calibration factor K is obtained by normalizing the quantity or the current of the ion beam I by a standard quantity or standard current of the ion beam $I_0$ by the following formula.

$$I/I_0 = K \quad (1)$$

Subsequently, the dose calibration factor K is transmitted to and stored in the memory 19 as the signal 18a. The memory stores the dose calibration factor K as a set of data by combining with a signal 21a from the position identification device 21. That is, the signal 21a and 18a are stored in the form: (ion beam position in the slit, the dose calibration factor at that position)=$(x_1, Kx_1)$. By scanning the disc support base 5, the same process shown by the chain line ① in FIG. 4 is carried out for positions $x_2, \ldots, x_n$, and a plurality of data sets, $(x_1, Kx_1), (x_2, Kx_2), \ldots (x_n, Kx_n)$ are obtained and stored in the memory. Since the quantity of ions in the ion beam is calibrated by the data sets, even if a portion of the slit is deformed in its width along the longitudinal direction, the change of the quantity of ions in the ion beam passing through a deformed portion of the slit 3 can be adjusted so as to yield a uniform dose distribution at every location on the wafer surface. That is, the uniform dose distribution is maintained at each positions on the wafer surface.

Second Method

The second method of ion implantation according to the present invention is described hereinafter.

The calibration of the quantity of ions in the ion beam along the longitudinal direction of the slit 3 is carried out prior to the ion injection.

Figure 5:
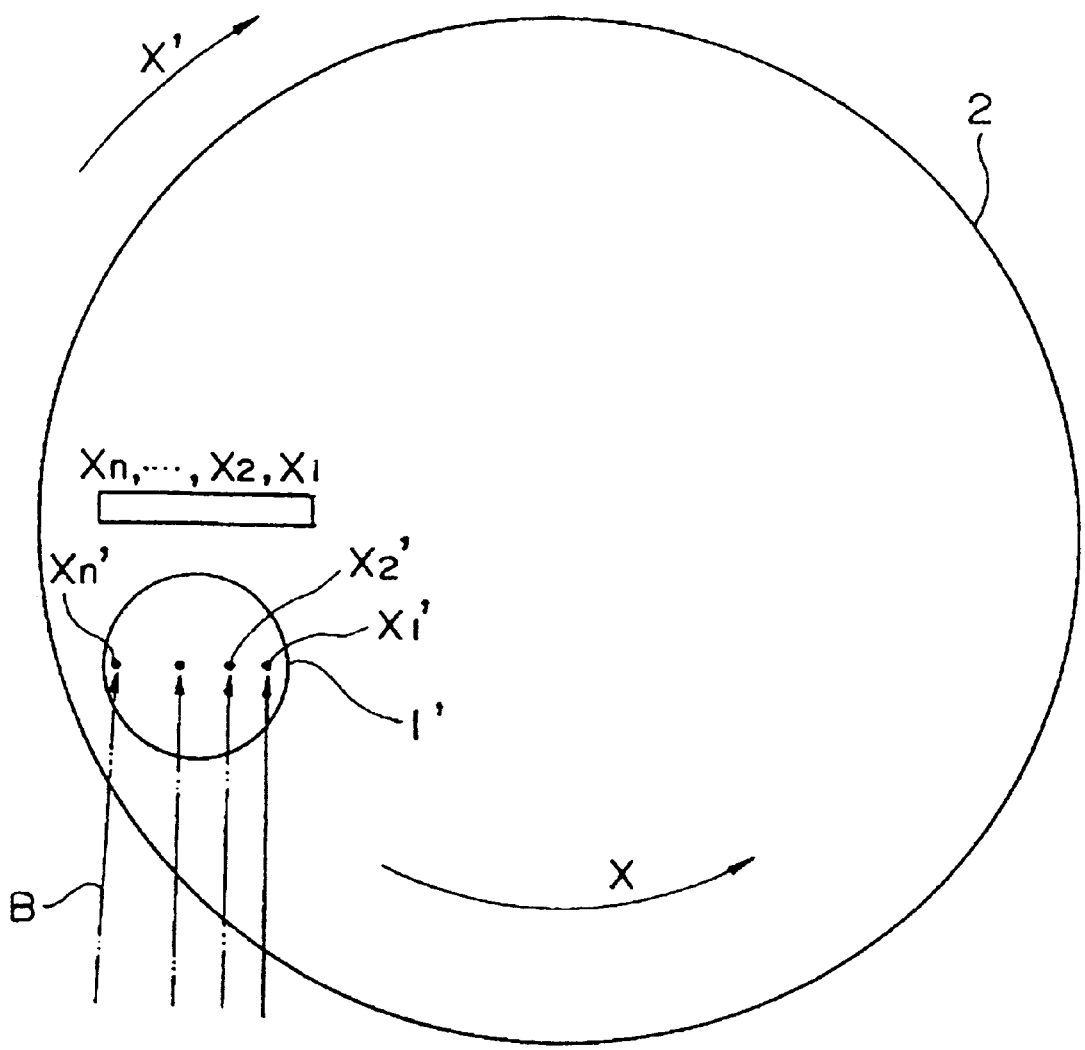
FIG. 5 is a diagram to explain a second method of ion implantation by the present invention.
Figure 6:
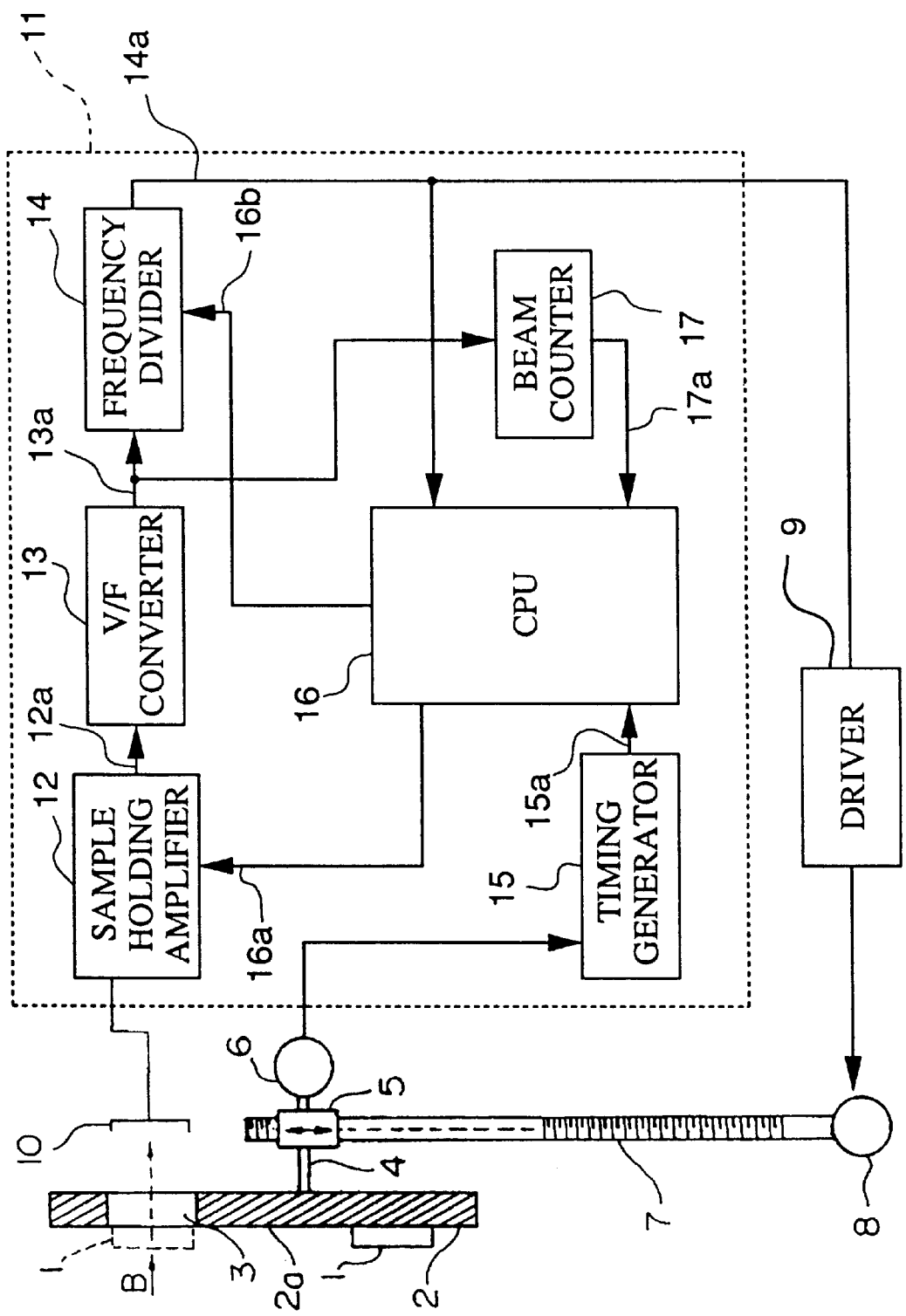
FIG. 6 is a schematic diagram showing the conventional apparatus for ion implantation and a part of which is shown as a cross sectional view.
Figure 7:
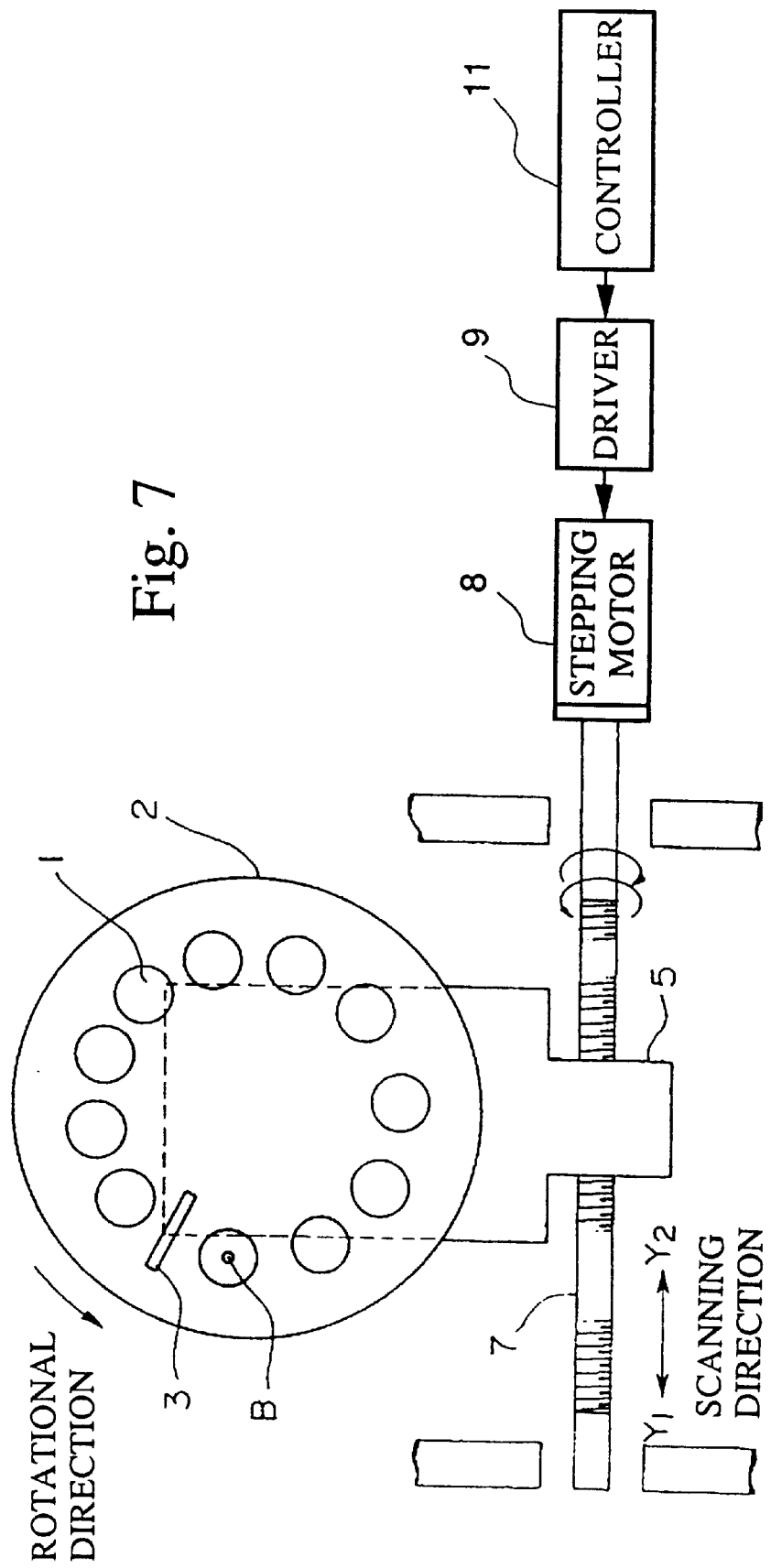
FIG. 7 is a schematic front view of the conventional apparatus for ion implantation.
Figure 8:
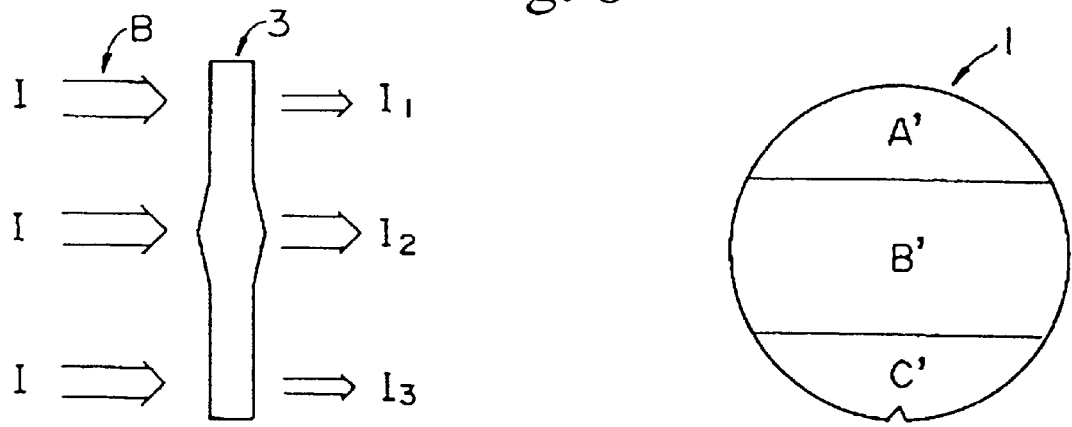
FIG. 8 is a diagram to explain the first problem in the conventional ion implantation apparatus.
Figure 9:
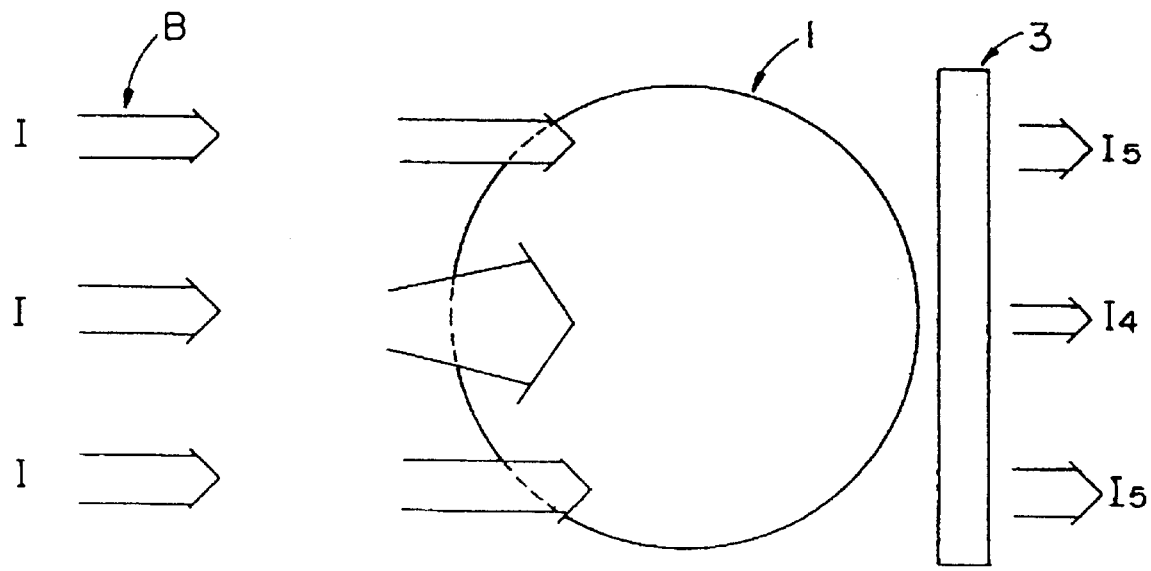
FIG. 9 is a diagram to explain the second problem in the conventional ion implantation apparatus.

As illustrated in FIG. 5, the disc 2 is driven such that the ion beam B is injected into the position $x_1'$ of the dummy wafer 1'. The disc 2 is then rotated in the direction of X, such that the ion beam B is injected into the position $x_1$ of the slit 3, and a set of data $(x_1, Kx_1)$ is obtained by the same procedure as that of the first method.

Next, the disc 2 is driven such that the ion beam B is admitted into the position $x_2$ of the dummy wafer 1', and the ion beam is then injected into the position $x_2$ of the slit 3, by rotating the disc 2 in the direction of X. The second data sets $(x_2, Kx_2)$ are obtained by the same procedure as that of the first method. By this procedure, the influence of charge-up at position $x_2'$ of the dummy wafer 1' can be reflected in the data sets. It is anticipated that spreading of the ion beam by the influence of the charge-up becomes maximum, when the ion beam B is admitted at the central position $x_k'$ of the dummy wafer 1'. The calibration process also reflects the influence of the charge up in the data set of $(x_k, Kx_k)$. By repeating the same procedure, a series of data sets are obtained and stored as data sets of $(x_1, Kx_1), (x_2, Kx_2), \ldots, (X_n, Kx_n)$.

The influence of the charge up can be eliminated by such procedures.

Operation of the ion implantation is carried out by the same method as shown in the first method.

According to the embodiments of the present invention, the measurement of the quantity of ions in the ion beam at respective positions along the longitudinal direction of the slit 3 is carried out by alternately injecting ion beam into the measurement point and into the point on the dummy wafer 1' adjacent to the measurement point in the wafer 1'. Thus, it is possible to compensate the change of the quantity of ions in the ion beam due to the deformation of the ion beam caused by the charge up of the wafer. At the same time, it is also possible to compensate the change of the quantity of ions in the ion beam due to the deformation of the slit 3. Consequently, the uniform dose distribution can be maintained by compensating the change of the quantity of ions in the ion beam due to the deformation of the slit 3 or the charge-up of the wafer 1.

The present invention is described by showing an example, in which the ion beam B is fixed and the disc 2 was driven for scanning. It is not excluded to scan the ion beam or to move both the ion beam B and the disc 4 for scanning.

The present method of ion implantation and an apparatus thereof have the following advantageous effects.

According to the first method of an ion implantation, since the method comprises steps of measuring the quantity of ions in the ion beam at respective positions along the longitudinal direction of the slit, providing a set of data representing the position and the quantity of ions in the ion beam, and calibrating the quantity of ions in the ion beam for injection, it is possible to inject the uniform ion beam by adjusting the quantity of ions in the ion beam passing through the slit so as to be uniformly injected on the wafer surface, even when the slit shape is deformed. That is, it is possible to yield a uniform dose of ion at every point on a wafer surface.

According to a second method of an ion implantation, the measurement of the quantity of ions in the ion beam is carried out by injecting ion beam alternately into the measurement position and into a position on the dummy wafer adjacent to that measurement position. This method enables elimination of the influences of charge-up by compensating the change of the quantity of ions in the ion beam caused by the deformation of the ion beam due to the charge-up of the wafer surface.

According to an ion implantation apparatus of the present invention, since the apparatus comprises, a position detecting means for detecting the position of the projecting ion beam, a measurement means for measuring the quantity of ions in the ion beam, memory means for storing a series of data sets, and an adjusting means for adjusting the quantity of ions in the ion beam for injecting the uniform ion beam based on the data sets, a uniform dose distribution is yielded at every positions in the wafer surface.

What is claimed is:

1. A method of ion implantation by utilizing an apparatus for ion implantation which is provided with a substrate holder for supporting a substrate comprising a substrate support surface and a slit formed through the thickness of at least a portion of said substrate support surface; an ion source for projecting an ion beam toward said substrate holder; a scanning mechanism for scanning the ion beam by moving either said ion beam or said substrate holder in two-dimensional and parallel directions to cover the substrate surface;

wherein the method comprises:
providing a plurality of data sets which include different position data along a longitudinal direction of said slit and quantity data of ions in the ion beam obtained by measurement of the ion beam at corresponding positions along the longitudinal direction of the slit; and
controlling the quantity of ions in the ion beam for implantation based on said data sets.

2. A method of ion implantation according to claim 1, wherein the method further comprising the steps of:
locating a dummy wafer adjacent to said slit prior to the ion beam injection; and
providing said plurality of data sets by measuring quantities of ions in the ion beam at respective points along the longitudinal direction of the slit while alternately injecting the ion beam to a measurement position and to a position on the dummy wafer adjacent to the measurement position.

3. An apparatus for ion implantation comprising:
a substrate holder comprising a substrate support surface for supporting a substrate and a slit formed by passing through a thickness of at least one portion of said substrate holder;
an ion source for projecting an ion beam towards the substrate;
a scanning mechanism for scanning the ion beam by moving either said ion beam or said substrate holder two-dimensionally and parallel to the substrate surface;
a position detector for detecting different positions of the ion beam along the longitudinal direction of the slit;
a measurement device for measuring the quantity of ions in the ion beam passing through the slit of the substrate holder;
a memory for storing a plurality of data sets obtained by said position detector and by said measurement device; and
a controller for controlling the quantity of ions in the ion beam to be injected to the substrate.

4. An apparatus for ion implantation according to claim 3, wherein the plurality of data sets includes position data obtained from the position detector and quantity data obtained from the measurement device.

5. An apparatus for ion implantation comprising:
a substrate holder comprising a substrate support surface that supports a substrate and includes a slit formed by passing through a thickness of said substrate holder;
an ion source that projects an ion beam towards the substrate;
a scanning mechanism that receives the ion beam from the ion source, the scanning mechanism scanning the ion beam by moving either said ion beam or said substrate holder two-dimensionally and parallel to the substrate surface;
a position detector that detects different positions of the ion beam along the longitudinal direction of the slit;
a measurement device that measures the quantity of ions in the ion beam passing through the slit of the substrate holder;
a memory device that communicates with the position detector and the measurement device, the memory device storing a plurality of data sets obtained by said position detector and by said measurement device; and
a controller that communicates with the ion source and the memory device, the controller controlling the quantity of ions in the ion beam to be injected to the substrate.

6. An apparatus for ion implantation according to claim 5, wherein the plurality of data sets includes position data obtained from the position detector and quantity data obtained from the measurement device.

* * * * *